United States Patent
Classen et al.

(10) Patent No.: US 8,326,444 B1
(45) Date of Patent: Dec. 4, 2012

(54) METHOD AND APPARATUS FOR PERFORMING AUDIO DUCKING

(75) Inventors: Holger Classen, Hamburg (DE); Sven Duwenhorst, Hamburg (DE)

(73) Assignee: Adobe Systems Incorporated, San Jose, CA (US)

( * ) Notice: Subject to any disclaimer, the term of this patent is extended or adjusted under 35 U.S.C. 154(b) by 1055 days.

(21) Appl. No.: 11/840,416

(22) Filed: Aug. 17, 2007

(51) Int. Cl.
- *G06F 17/00* (2006.01)
- *G06F 3/16* (2006.01)
- *H04R 29/00* (2006.01)
- *H03G 7/00* (2006.01)

(52) U.S. Cl. ............. 700/94; 715/727; 381/58; 381/106

(58) Field of Classification Search .............. 700/94; 715/727; 381/58, 104, 106, 107, 108; 84/627, 84/633; 386/241, 278, 280, 281
See application file for complete search history.

(56) References Cited

U.S. PATENT DOCUMENTS

| | | | | |
|---|---|---|---|---|
| 6,901,362 | B1 * | 5/2005 | Jiang et al. | 704/214 |
| 2004/0027369 | A1 * | 2/2004 | Kellock et al. | 345/716 |
| 2006/0274902 | A1 * | 12/2006 | Hume et al. | 381/17 |
| 2007/0260968 | A1 * | 11/2007 | Howard et al. | 715/500.1 |
| 2007/0292106 | A1 * | 12/2007 | Finkelstein et al. | 386/55 |

OTHER PUBLICATIONS

Twisted Lemon, SideKick V3, Nov. 21, 2006, Twisted Lemon, http://web.archive.org/web/20060206064331/http://www.twistedlemon.nl/, entire document.*

* cited by examiner

*Primary Examiner* — Jesse Elbin
(74) *Attorney, Agent, or Firm* — Kilpatrick Townsend & Stockton LLP

(57) ABSTRACT

A method, apparatus and computer program product for performing audio ducking is presented. A plurality of tracks are displayed in a user interface, each track of the plurality of tracks including at least one audio clip. A first clip of the plurality of tracks is linked to at least one other clip of the plurality of tracks. At least one audio clip of the first track is preprocessed to obtain characteristic data of the at least one audio clip of the first track. The characteristic data of the at least one audio clip is utilized to determine level change parameters for the at least one clip of the plurality of tracks linked to the first clip.

21 Claims, 6 Drawing Sheets

METHOD AND APPARATUS FOR PERFORMING AUDIO DUCKING

CROSS REFERENCE TO RELATED APPLICATIONS

The present application is related to patent application titled "Method and Apparatus for Audio Mixing", Ser. No. 11/840,402, filed on even date herewith, and which is incorporated herein by reference in its entirety.

BACKGROUND

Audio ducking is an effect commonly used in radio and music. Audio ducking is an effect where the level of one signal is reduced by the presence and strength of another signal called side-chain signal. Therefore side-chaining uses the dynamic level of another input to control the level of the signal. A typical application is to automatically lower the level of a musical signal when a voice-over starts, and to automatically bring the level up again when the voice-over stops. It can lead to a "pumping" or modulating effect. An example of the modulating effect occurs when a music signal is side-chained to a voice over. The voice over may begin and pause for a brief amount of time, then begin again etc. The side chaining results in the music level being reduced when the voice over starts, being raised during the voice over pause, being reduced again when the voice over starts again, etc.

Certain terms used herein will now be defined. Ducking is a leveling mechanism where the level of one signal is reduced by the presence/level of another signal. Look Ahead Time comprises a time constant that is used for "pre-fetching" and analyzing the incoming audio material. Peak data of an audio file is used to visualize the audio file at a certain zoom level to avoid a full scan of the audio file. In order to determine peak data of an audio file, the entire audio file is scanned and divided in sections of appropriate number of audio samples. A section is processed to calculate the peak values (minimum/maximum) within the section as well as the RMS value or other loudness measure units. DAW (digital audio workstation) is a software environment used to record, edit and mix audio files. Clips are arrange in a sequence and placed on tracks. The length of a clip can be different than the audio the clip contains. Furthermore the audio can have sections of silence.

In the hardware world, several mechanisms are available for reducing the level of a first audio signal automatically by "side chaining" a second audio signal into a leveling device. One example is a radio station where the first signal (music) is lowered by specified settings when a second signal (a station announcer) occurs. The disadvantage of this mechanism is that the second signal must be present to reduce the first signal. This can only be done in real time; therefore the signal reduction of first signal is almost always noticeable and more or less drastic. The leveling device detects the second signal and lowers the volume of the first signal in real time to a predetermined reduction amount (e.g., some 3 dB). A time behavior of the first signal reduction (referred to as an Attack) can rarely be set because in the moment the second signal occurs this second signal has the priority. The level reduction of the first signal has to happen quickly, if not immediately. This does not sound good in most cases. A similar situation takes place for the "release time" of the first signal in the moment the second signal (side-chain) is no longer present. The release time is static and not program pending, so usually a quick level change from the reduced to the original level happens. If the processor has a significant large look-ahead time, the attack times can be made large enough to smoothly fade out the music before the voice starts. However, look-ahead time increases the overall system latency.

One workaround is to manually lower the first signal shortly before the second signal starts and bring the level of the first signal up later. These actions over time are called fades. The fades "algorithmic" behavior (more linear, more logarithmic) is determined by the manual action of the audio engineer operating the mixing desk.

In a Digital Audio Workstation (DAW) environment, a Look Ahead Time can be set for the leveling device. This time is not program pending and often too short. Typically the human ear can distinguish between a "mechanical" fade and an "artistic/well intended" fade. It is usually not possible to choose between different fade curves (logarithmic/linear etc.).

SUMMARY

Conventional mechanisms such as those explained above suffer from a variety of deficiencies. One such deficiency is that conventional ducking devices change the level of the first signal too rapidly in the presence of the second signal. Furthermore the ducking device is threshold controlled and therefore is changing the level depending of the signal level in the side chain (the second signal). The result is that the first signal is reduced in level very fast with the first audio in the second signal) and during the second signal the first signal is modulated by the level of the second signal. Other deficiencies in conventional ducking applications include: attack and release times don't have practical ranges; attack and release curves can't be determined; look ahead time is often too short; and gain reduction behavior/amount is generally not program dependent. Conventional mechanisms only offer linear fade behavior and the level reduction are controlled by side-chain audio signal modulation.

Embodiments of the invention significantly overcome such deficiencies and provide mechanisms and techniques that provide a method and apparatus for performing audio ducking. An "intelligent" mechanism is provided which serves to lower the signal of one or multiple audio clips/files before or in the moment a "more important" or "more relevant" audio signal is present, thus improved audio mixing capabilities are provided in a Digital Audio Workstation.

In a particular embodiment of a method for audio ducking the method begins with displaying a plurality of tracks in a user interface, each track of the plurality of tracks including at least one audio clip. The method further includes linking a first clip of the plurality of tracks to at least one other clip of the plurality of tracks. The method also includes preprocessing the audio clip of the first track to obtain characteristic data of the audio clip and utilizing the characteristic data of the at least one audio clip of the first track to determine level change parameters (also referred to as audio ducking parameters) for the at least one other clip of the plurality of tracks linked to the first clip. While clip-to-clip linking is shown and described, it should be appreciated that a clip can be linked to an entire track, an entire track can be linked to a clip and an entire track can be linked to another entire track.

Other embodiments include a computer readable medium having computer readable code thereon for audio ducking, the computer readable medium including instructions for displaying a plurality of tracks in a user interface, each track of the plurality of tracks including at least one audio clip. The computer readable medium further includes instructions for linking a first clip of the plurality of tracks to at least one other clip of the plurality of tracks. Additionally, the computer readable medium includes instructions for preprocessing the audio clip of the first track to obtain characteristic data of the audio clip and utilizing characteristic data of the at least one audio clip to determine level change parameters for the at least one other clip of the plurality of tracks linked to the first clip. Again, while clip-to-clip linking is shown and described, it should be appreciated that a clip can be linked to an entire track, an entire track can be linked to a clip and an entire track can be linked to another entire track.

Still other embodiments include a computerized device, configured to process all the method operations disclosed herein as embodiments of the invention. In such embodiments, the computerized device includes a memory system, a processor, communications interface in an interconnection mechanism connecting these components. The memory system is encoded with a process that provides audio ducking as explained herein that when performed (e.g. when executing) on the processor, operates as explained herein within the computerized device to perform all of the method embodiments and operations explained herein as embodiments of the invention. Thus any computerized device that performs or is programmed to perform up processing explained herein is an embodiment of the invention.

Other arrangements of embodiments of the invention that are disclosed herein include software programs to perform the method embodiment steps and operations summarized above and disclosed in detail below. More particularly, a computer program product is one embodiment that has a computer-readable medium including computer program logic encoded thereon that when performed in a computerized device provides associated operations providing audio ducking as explained herein. The computer program logic, when executed on at least one processor with a computing system, causes the processor to perform the operations (e.g., the methods) indicated herein as embodiments of the invention. Such arrangements of the invention are typically provided as software, code and/or other data structures arranged or encoded on a computer readable medium such as an optical medium (e.g., CD-ROM), floppy or hard disk or other a medium such as firmware or microcode in one or more ROM or RAM or PROM chips or as an Application Specific Integrated Circuit (ASIC) or as downloadable software images in one or more modules, shared libraries, etc. The software or firmware or other such configurations can be installed onto a computerized device to cause one or more processors in the computerized device to perform the techniques explained herein as embodiments of the invention. Software processes that operate in a collection of computerized devices, such as in a group of data communications devices or other entities can also provide the system of the invention. The system of the invention can be distributed between many software processes on several data communications devices, or all processes could run on a small set of dedicated computers, or on one computer alone.

It is to be understood that the embodiments of the invention can be embodied strictly as a software program, as software and hardware, or as hardware and/or circuitry alone, such as within a data communications device. The features of the invention, as explained herein, may be employed in data communications devices and/or software systems for such devices such as those manufactured by Adobe Systems Incorporated of San Jose, Calif.

BRIEF DESCRIPTION OF THE DRAWINGS

The foregoing will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the presently disclosed method and apparatus for performing audio ducking solve the aforementioned problems in a DAW environment. The advantage is that this is the first stage/component of an "intelligent mixing engine" Having the non-audio professional in mind, an intelligent mechanism is provided that allows audio non-professionals to mix their audio assets in an easy but sophisticated way. Instead of using real-time controlled leveling devices (e.g. a conventional audio ducker), a user interface of an application displays the sequence that is controlling the time behavior. Overall the timing constants (fade in and fade out) and level reduction is program dependent. For example, a commercial would typically utilize a fast fade in, and a small level reduction whereas a documentary would utilize a slow fade in and a greater level reduction.

The audio ducking application automatically determines the overall length of a fade down/up and reduction process based on characteristics of the audio clip. This characteristic data includes one or more of peak data for the clip, an RMS value for the clip and clip length. As a result the side chain clip isn't modulating the first clip. Additionally, keyframes are used to visualize fade behavior and amount of level reduction. An operator can further adjust the audio ducking using the keyframes, for example by adjusting the position of the keyframes and/or adjusting the rate of the level change.

Figure 1:
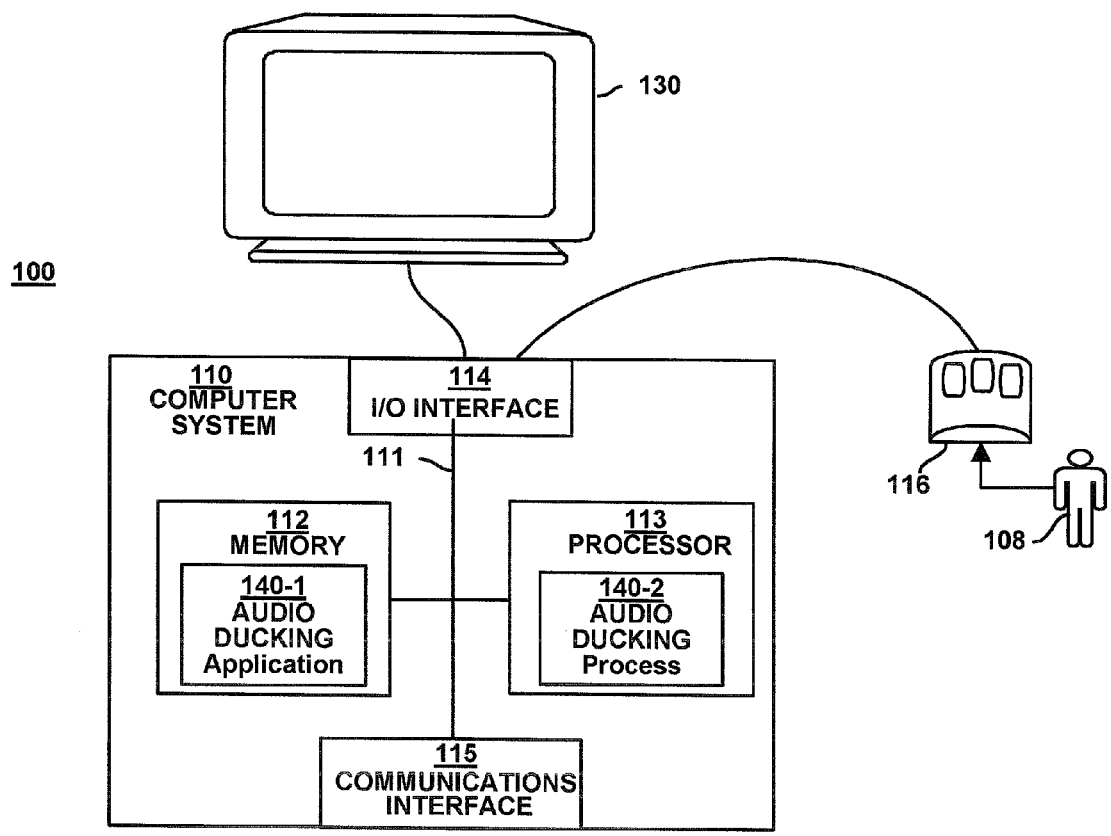
FIG. 1 illustrates an example computer system architecture for a computer system that performs audio ducking in accordance with embodiments of the invention.

FIG. 1 is a block diagram illustrating an example computer system 100 for implementing an audio ducking function and/or other related processes to carry out the different functionality as described herein. As shown, computer system 100 of the present example includes an interconnect 111 that couples a memory system 112 and a processor 113 an input/output interface 114, and a communications interface 115. A user 108 may use an input device 116, which is connected to the computer system 110 via input/output interface 114. A monitor 130 may also be connected to the input/output interface 114.

As shown, memory system 112 is encoded with audio ducking application 140-1. Audio ducking application 140-1 can be embodied as software code such as data and/or logic instructions (e.g., code stored in the memory or on another computer readable medium such as a disk) that support functionality according to different embodiments described herein.

During operation, processor 113 of computer system 100 accesses memory system 112 via the interconnect 111 in order to launch, run, execute, interpret or otherwise perform the logic instructions of the audio ducking application 140-1. Execution of audio ducking application 140-1 produces processing functionality in audio ducking process 140-2. In other words, the audio ducking process 140-2 represents one or more portions of the audio ducking application 140-1 (or the entire application) performing within or upon the processor 113 in the computer system 100.

It should be noted that, in addition to the audio ducking process 140-2, embodiments herein include the audio ducking application 140-1 itself (i.e., the un-executed or non-performing logic instructions and/or data). The audio ducking application 140-1 can be stored on a computer readable medium such as a floppy disk, hard disk, or optical medium. The audio ducking application 140-1 can also be stored in a memory type system such as in firmware, read only memory (ROM), or, as in this example, as executable code within the memory system 112 (e.g., within Random Access Memory or RAM).

In addition to these embodiments, it should also be noted that other embodiments herein include the execution of audio ducking application 140-1 in processor 113 as the audio ducking process 140-2. Those skilled in the art will understand that the computer system 100 can include other processes and/or software and hardware components, such as an operating system that controls allocation and use of hardware resources associated with the computer system 100.

Figure 2:
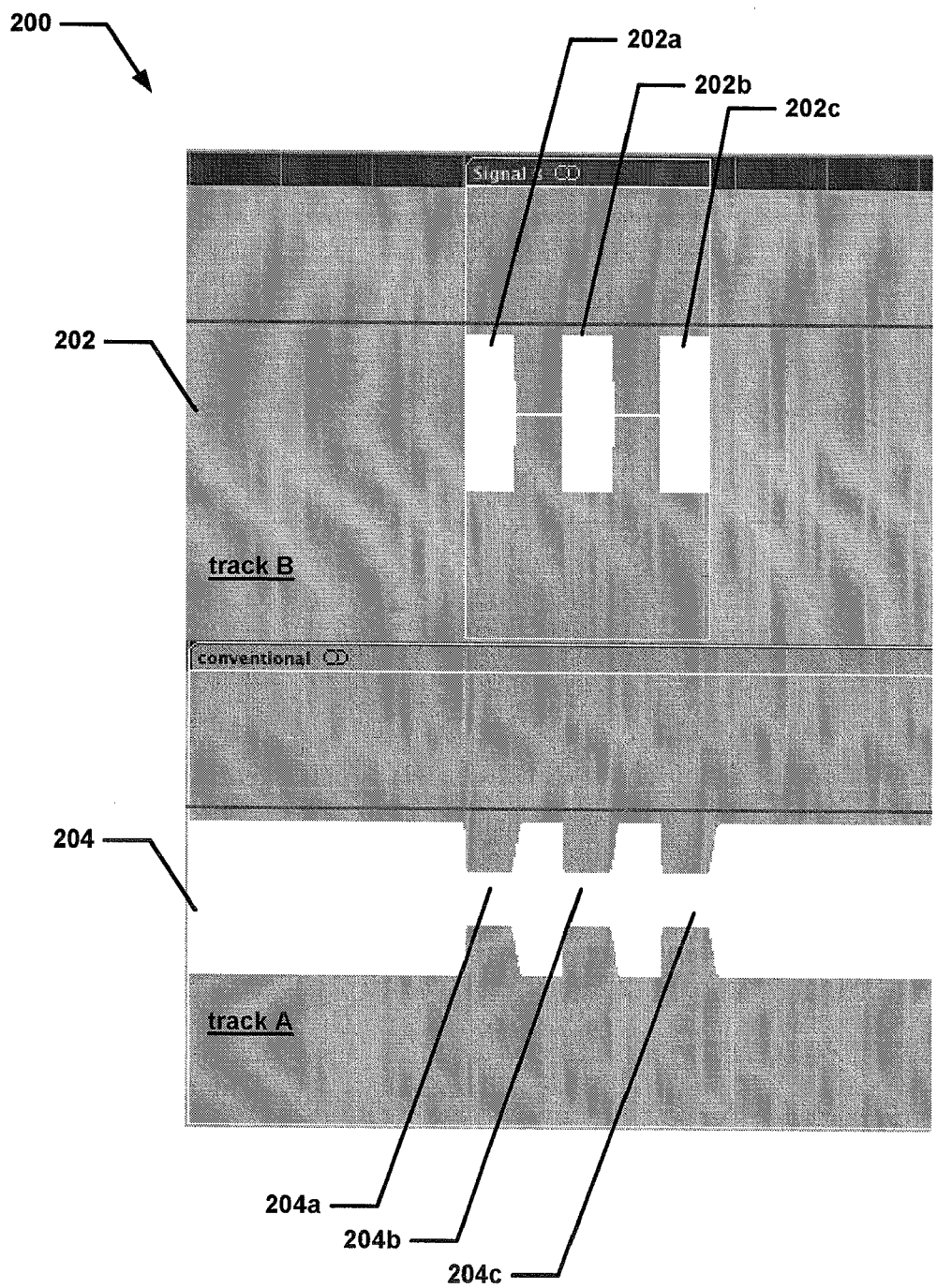
FIG. 2 depicts a screen shot of a graphical user interface showing an initial set of audio clips.

Referring now to FIG. 2, an example of the graphical user interface 200 used for audio ducking is shown. Two tracks are shown, track A (204) and track B (202). In conventional ducking, track A is linked to track B such that at the time an audio signal (also referred to throughout as a clip) 202a is present, the signal of track A (204a) is reduced accordingly. When audio signal 202a is over, the signal in track A returns to its original level. The same functionality takes place when audio signal 202b is present and when audio signal 202c is present, as shown by level reduced signals 204b and 204c respectively. In this example, signal 204 is being modulated by signal 202, which may be undesirable in certain environments. While track-to-track linking is shown and described, it should be appreciated that other embodiments incorporating these concepts are also applicable. For example, a clip can be linked to an entire track, such that the clip is processed and level change parameters for the entire track are determined. Additionally, an entire track can be linked to a clip such that the track is processed and level change parameters for the clip are determined. Further, a first clip can be linked to a second clip such that the first clip is processed and level change parameters for the second clip are determined.

Figure 3:
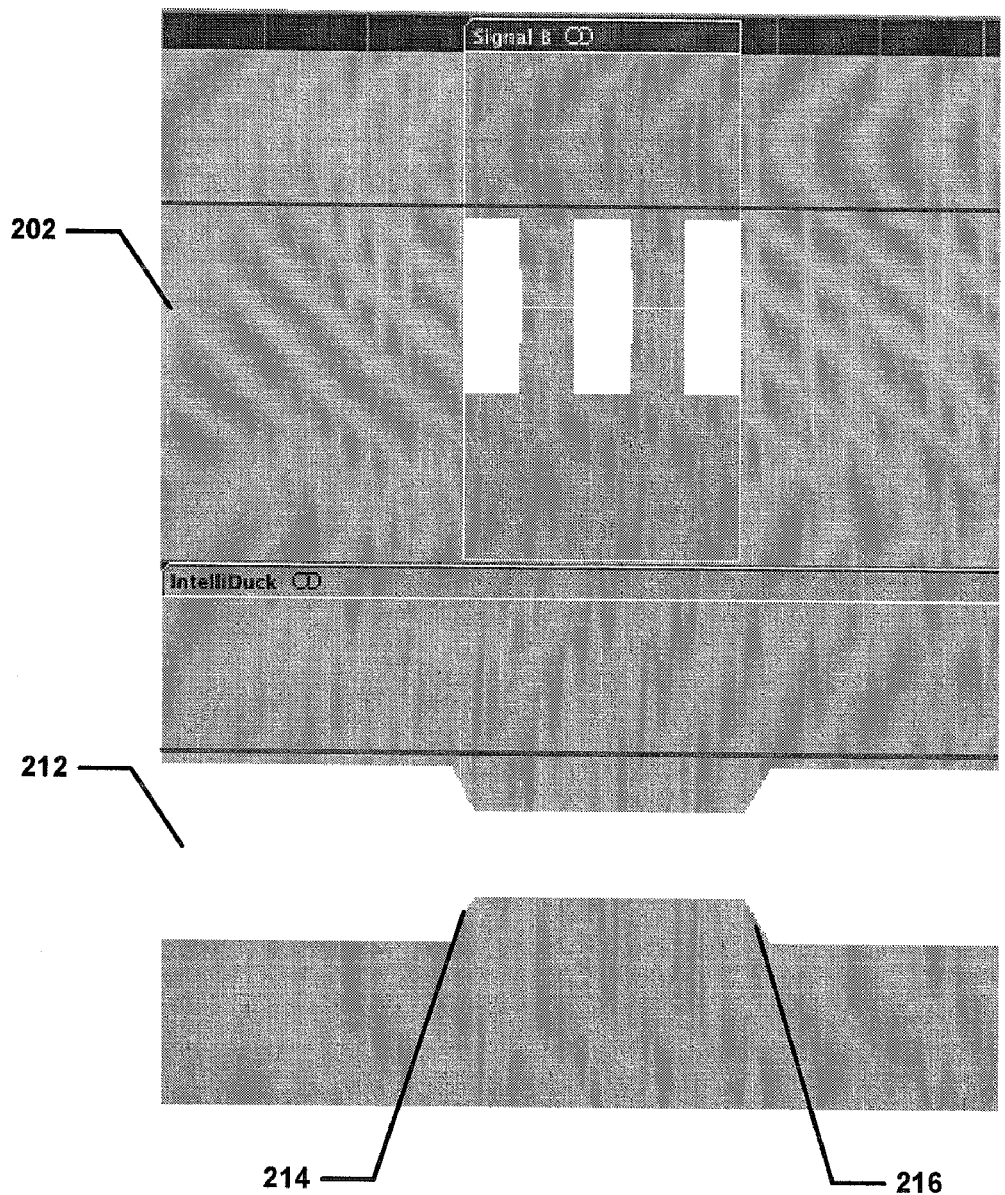
FIG. 3 depicts a screen shot of a graphical user interface showing a resulting clip from audio ducking provided in accordance with embodiments of the invention.

Referring now to FIG. 3, in accordance with embodiments of the invention, an improved set of audio ducking signals levels are shown. Characteristic data of the signal 202 is used to determine the timing of the audio ducking performed and also the amount of audio ducking performed. The characteristic data includes one or more of peak data, RMS value data or other loudness measure units and clip length. Peak data describes the instantaneous maximum amplitude value within one period of the signal concerned. RMS value data comprises a statistical measure of the loudness of a signal. There are other methods to compute a value, which describes the perceived loudness of a human being, which can be used instead of the RMS value. As shown in FIG. 3, signal 212 does a fade to a lower level at point 214 and maintains the lower level until a fade at 216 returns the signal to it's original level.

As can be seen, there is no modulation of signal 212, despite the varying levels of signal 202.

Figure 4:
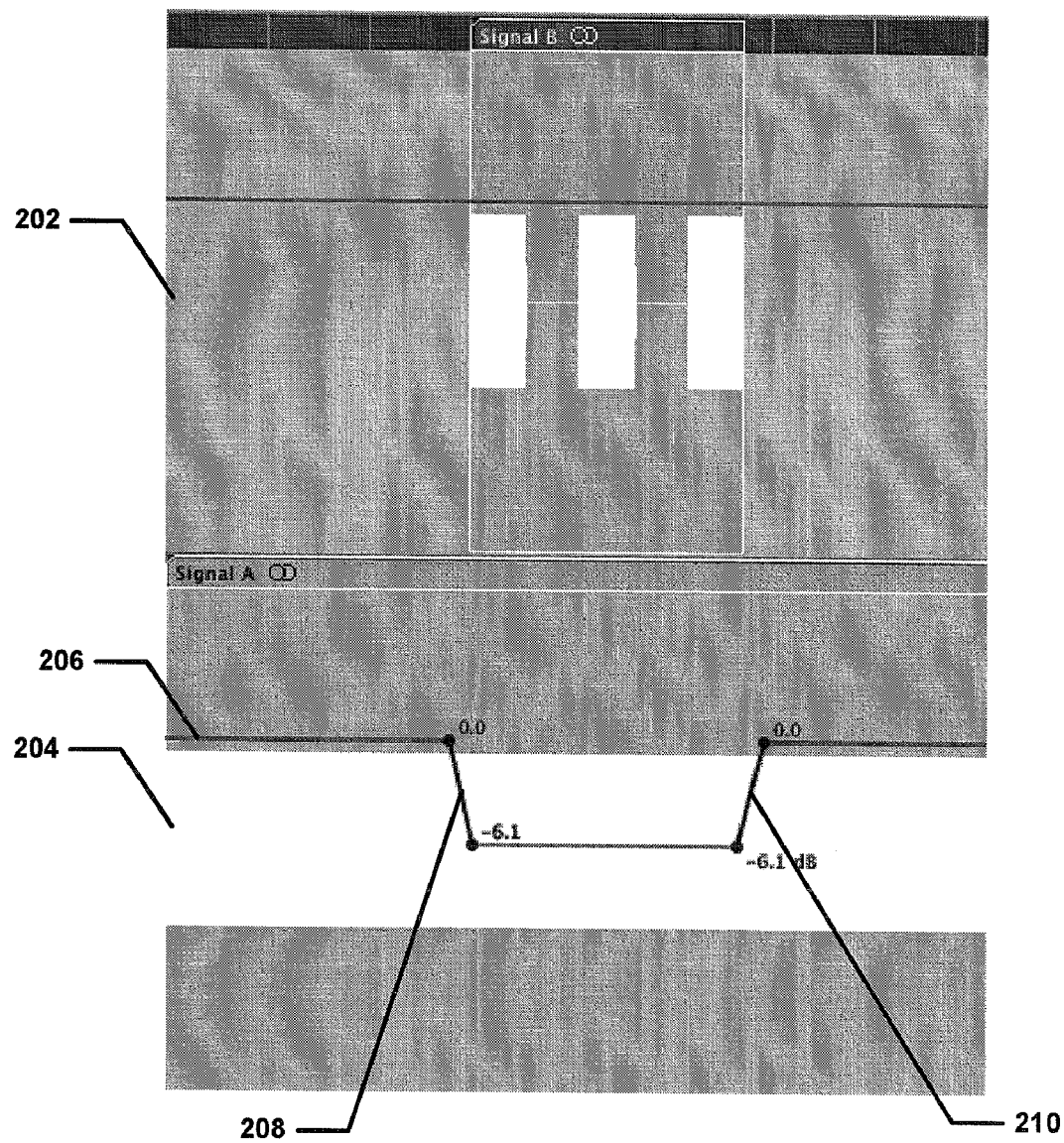
FIG. 4 depicts a screen shot of a graphical user interface showing keyframes relating to an audio clip.

Referring now to FIG. 4, a similar GUI is shown wherein a first part of a method for audio ducking in accordance with embodiments of the present invention has been performed. Each clip 202 and 204 in a sequence is visually displayed on a screen and requires preprocessed peak data to represent the audio data. Typically only peak data is used, but also RMS data or other loudness measure units can be computed and utilized. Both tracks (track A and track B) are linked such that track B controls the level of track A.

The ducking application knows when clip B starts and with the help of the peak data, the ducking application also knows if and when the audio exceeds a certain level (threshold). Therefore the ducking application can set the level change parameters upon using the peak data and the knowledge of clip start time and the clip end time.

The user can further specify, for example via a preset selector, the type of ducking the user would like to achieve. For example, a commercial would typically utilize a fast fade in and fade out and a small level reduction whereas a documentary would utilize a slow fade in and fade out and a greater level reduction. A ducking curve 206 is graphically shown to visualize the level change over time. The user can change the fade type(s) and the placement of the fades. The fades are indicated by keyframes 208 and 210, which show a gradual fade from a first level to a second level and a gradual fade from the second level to the first level.

Figure 5:
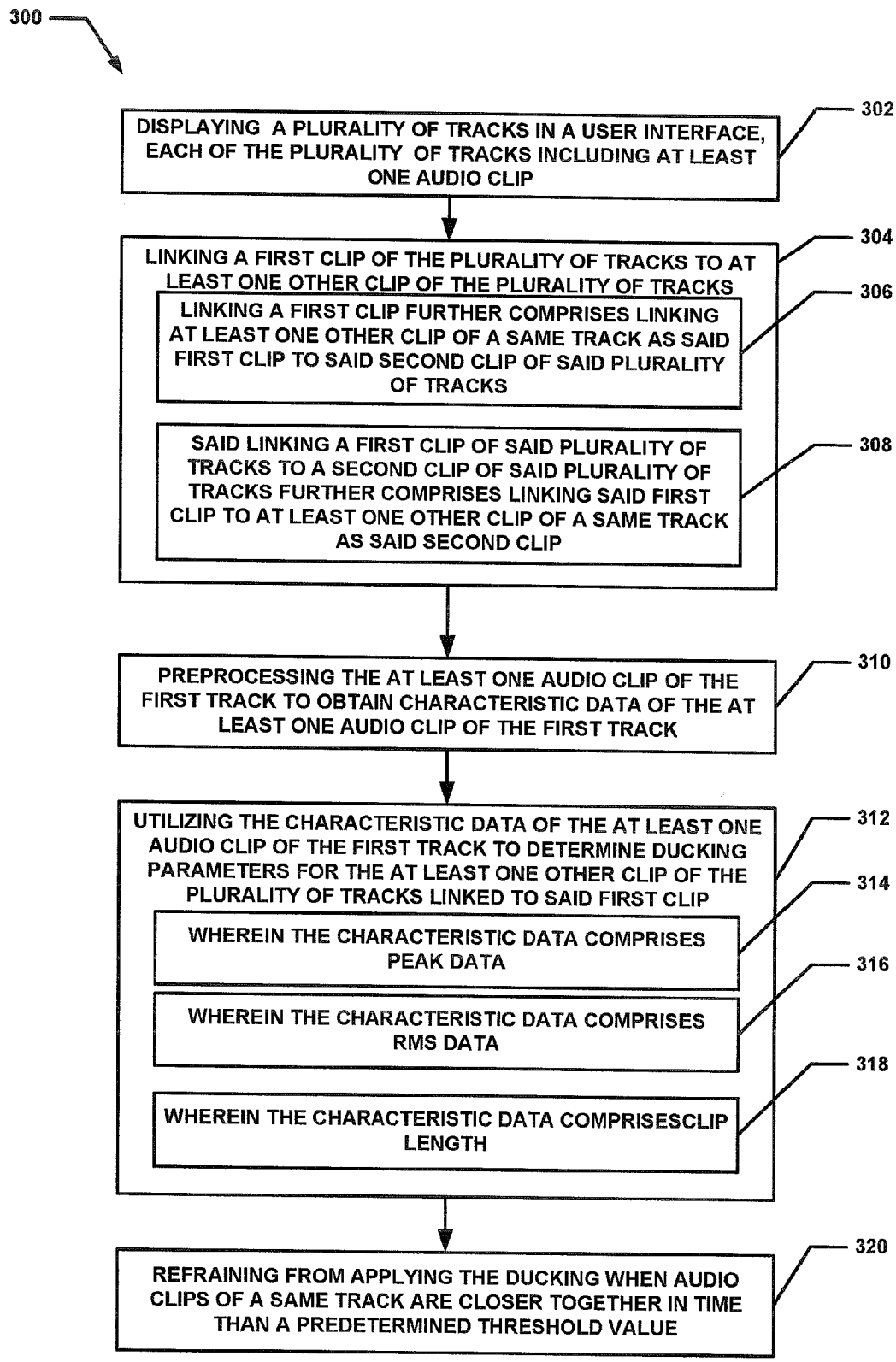
FIG. 5 is a flow diagram of a particular embodiment of a method of audio ducking in accordance with embodiments of the invention.
Figure 6:
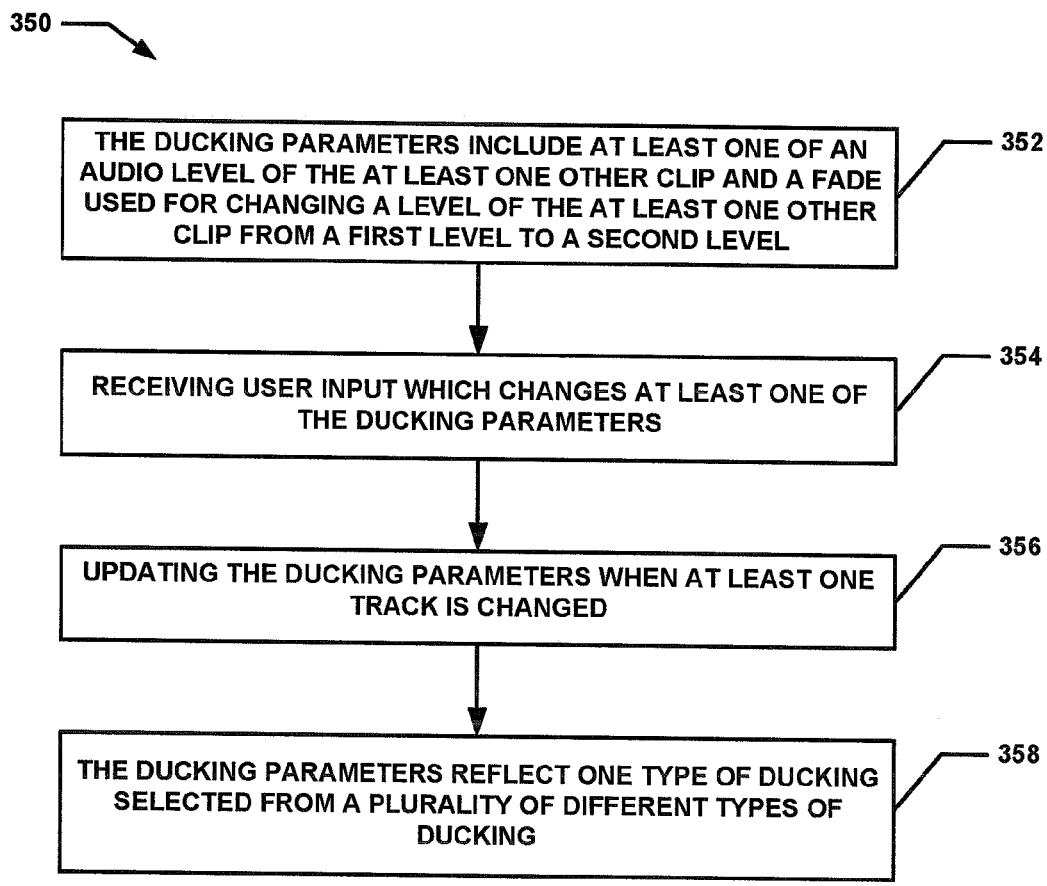
FIG. 6 is a flow diagram of a particular embodiment of a method of editing level change parameters in accordance with embodiments of the invention.

If clips are too close to each other (below fade in/out times), the reduction is not applied. The ducking curve is automatically updated when clips are moved/added/removed/content change for either of the linked tracks or linked clips. As described above, by way of the present method and apparatus for providing audio ducking, the fade behavior selectable by the user and the level reduction is controlled by the ducking application peak data representation A flow chart of the presently disclosed methods is depicted in FIGS. 5 and 6. The rectangular elements are herein denoted "processing blocks" and represent computer software instructions or groups of instructions. Alternatively, the processing blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required in accordance with the present invention. It should be noted that many routine program elements, such as initialization of loops and variables and the use of temporary variables are not shown. It will be appreciated by those of ordinary skill in the art that unless otherwise indicated herein, the particular sequence of steps described is illustrative only and can be varied without departing from the spirit of the invention. Thus, unless otherwise stated the steps described below are unordered meaning that, when possible, the steps can be performed in any convenient or desirable order.

Referring now to FIG. 5, a particular embodiment of a method 300 for providing audio ducking is shown. The method 300 begins with processing block 302, which discloses displaying a plurality of tracks in a user interface, each track of the plurality of tracks including at least one audio clip. One track may be relating to music, while another track may be of an announcer. Preferably the method is performed using a digital audio workstation. Processing block 304 states linking a first clip of the plurality of tracks to at least one other clip of the plurality of tracks. The clips are linked such that one clip controls the level of another clip. Processing block 306 discloses wherein the linking a first clip further comprises linking at least one other clip of a same track as the first clip to the second clip of the plurality of tracks. Processing block 308 states wherein the linking a first clip of the plurality of tracks to a second clip of the plurality of tracks further comprises linking the first clip to at least one other clip of a same track as the second clip. Stated differently, while clip-to-clip linking is shown and described, it should be appreciated that a clip can be linked to an entire track, an entire track can be linked to a clip and an entire track can be linked to another entire track. For example, in FIGS. 2-4, track A is linked to track B.

Processing block 310 states preprocessing the at least one audio clip of the first track to obtain the characteristic data of the at least one audio clip of the first track.

Processing block 312 recites utilizing characteristic data of the at least one audio clip of the first track to determine level change parameters (ducking parameters) for the at least one other clip of the plurality of tracks linked to the first clip. Processing block 314 states wherein characteristic data comprises peak data. Peak data describes the instantaneous maximum amplitude value within one period of the signal concerned. Processing block 316 discloses wherein the characteristic data comprises Root Mean Square (RMS) value data. RMS value data comprises a statistical measure of the magnitude of a signal and therefore also a measure of perceived loudness. There are other methods to compute a measure of the perceived loudness of a human being, which can be used as well. Processing block 318 recites wherein the characteristic data comprises clip length.

Processing block 320 recites refraining from applying the ducking when audio clips of a same track are closer together in time than a predetermined threshold value. This prevents modulating the first signal, which can occur when, for example, a music signal is side-chained to a voice over. The voice over may begin and pause for a brief amount of time, then begin again etc. The side chaining results in the music level being reduced when the voice over starts, being raised during the voice over pause, being reduced again when the voice over starts again, etc.

Referring now to FIG. 6, a flow diagram of a particular embodiment of a method 352 of editing level change parameters in accordance with embodiments of the invention is shown. The method 350 begins with processing block 352 which discloses the level change parameters include at least one of an audio level of the at least one other clip and a fade used for changing a level of the at least one other clip from a first level to a second level.

Processing block 354 states receiving user input which changes at least one of the level change parameters. The user can vary, by way of keyframes, when the level change takes place. The user can also vary the fade itself, making the fade happen quicker or slower.

Processing block 356 discloses updating the level change parameters when at least one track is changed. Processing block 358 states the level change parameters reflect one type of ducking selected from a plurality of different types of ducking. For example, a commercial would typically utilize a fast fade in, and a small level reduction whereas a documentary would utilize a slow fade in and a greater level reduction.

As described above, an intelligent ducking mechanism for use with a digital audio workstation is presented which uses a visual representation of the clip to determine level change parameters for the linked clip such that an improved audio ducking is provided and modulation is reduced or eliminated.

Having described preferred embodiments of the invention it will now become apparent to those of ordinary skill in the art that other embodiments incorporating these concepts may be used. Additionally, the software included as part of the invention may be embodied in a computer program product that includes a computer useable medium. For example, such a computer usable medium can include a readable memory device, such as a hard drive device, a CD-ROM, a DVD-ROM, or a computer diskette, having computer readable program code segments stored thereon. The computer readable medium can also include a communications link, either optical, wired, or wireless, having program code segments carried thereon as digital or analog signals. Accordingly, it is submitted that that the invention should not be limited to the described embodiments but rather should be limited only by the spirit and scope of the appended claims.

What is claimed is:

1. A method comprising:
preprocessing a first clip to obtain characteristic data of the first clip, wherein the characteristic data comprises an average level of the first clip; and
utilizing the characteristic data of said first clip to determine level change parameters for audio ducking a second clip when the first clip is used with the second clip, wherein the audio ducking comprises adjusting a level of a signal of the second clip based at least in part on the level change parameters, wherein adjusting the level of the signal of the second clip in the audio ducking is determined based at least in part on the average level of the first clip to minimize modulation while the first clip is used with the second clip.

2. The method of claim 1 further comprising
displaying a plurality of tracks in a user interface, each track of said plurality of tracks including at least one audio clip, wherein the plurality of tracks comprise the first clip and the second clip; and
linking the first clip to the second clip, wherein said linking further comprises linking at least one other clip of a same track as said first clip to said second clip of said plurality of tracks.

3. The method of claim 1 further comprising
displaying a plurality of tracks in a user interface, each track of said plurality of tracks including at least one audio clip, wherein the plurality of tracks comprise the first clip and the second clip; and
linking the first clip to the second clip, wherein said linking further comprises linking said first clip to at least one other clip of a same track as said second clip.

4. The method of claim 1 wherein said level change parameters include at least one of an audio level of said second clip and a fade used for changing a level of said second clip from a first level to a second level.

5. The method of claim 1 further comprising receiving user input which changes at least one of said level change parameters.

6. The method of claim 1 further comprising updating said level change parameters when at least one clip is changed.

7. The method of claim 1 wherein said level change parameters reflect one type of level change selected from a plurality of different types of level change.

8. The method of claim 1 wherein utilizing said characteristic data of said first clip to determine level change parameters for audio ducking said second clip further comprises determining the level change parameters such that a level change changing a level of said second clip will be applied unless said second clip and another clip of a same track as said second clip are closer together in time than a predetermined threshold value.

9. The method of claim 1 wherein the audio ducking comprises timing for adjusting the level of the signal of the second clip, wherein the characteristic data comprises a clip length of the first clip, wherein the timing for adjusting the level of the signal of the second clip in the audio ducking is determined based at least in part on the clip length of the first clip to minimize modulation while the first clip is used with the second clip.

10. A non-transitory computer readable medium having computer readable code thereon for performing audio ducking, the medium comprising:
 instructions for preprocessing a first clip to obtain characteristic data of the first clip, wherein the characteristic data comprises an average level of the first clip; and
 instructions for utilizing the characteristic data of said first clip to determine level change parameters for audio ducking a second clip when the first clip is used with the second clip, wherein the audio ducking comprises adjusting a level of a signal of the second clip based at least in part on the level change parameters, wherein adjusting the level of the signal of the second clip in the audio ducking is determined based at least in part on the average level of the first clip to minimize modulation while the first clip is used with the second clip.

11. The computer readable medium of claim 10 wherein the medium further comprises:
 instructions for displaying a plurality of tracks in a user interface, each track of said plurality of tracks including at least one audio clip, wherein the plurality of tracks comprise the first clip and the second clip; and
 instructions for linking the first clip to the second clip, wherein said linking further comprises linking at least one other clip of a same track as said first clip to said second clip of said plurality of tracks.

12. The computer readable medium of claim 10 wherein the medium further comprises:
 instructions for displaying a plurality of tracks in a user interface, each track of said plurality of tracks including at least one audio clip, wherein the plurality of tracks comprise the first clip and the second clip; and
 instructions for linking the first clip to the second clip, wherein said linking further comprises linking said first clip to at least one other clip of a same track as said second clip.

13. The computer readable medium of claim 10 wherein said level change parameters include at least one of an audio level of said second clip and a fade used for changing a level of said second clip from a first level to a second level.

14. The computer readable medium of claim 10 further comprising instructions for receiving user input that changes at least one of said level change parameters.

15. The computer readable medium of claim 10 further comprising instructions for updating said level change parameters when at least one clip is changed.

16. The computer readable medium of claim 10 wherein said level change parameters reflect one type of level change selected from a plurality of different types of level change.

17. The computer readable medium of claim 10 wherein utilizing said characteristic data of said first clip to determine level change parameters for audio ducking said second clip further comprises determining the level change parameters such that a level change changing a level of said second clip will be applied unless said second clip and another clip of a same track as said second clip are closer together in time than a predetermined threshold value.

18. A computer system comprising:
 a memory;
 a processor;
 a communications interface;
 an interconnection mechanism coupling the memory, the processor and the communications interface; and
 wherein the memory is encoded with an application providing audio ducking, that when performed on the processor, provides a process for processing information, the process causing the computer system to perform the operations comprising:
 preprocessing a first clip to obtain characteristic data of the first clip, wherein the characteristic data comprises an average level of the first clip; and
 utilizing the characteristic data of said first clip to determine level change parameters for audio ducking a second clip when the first clip is used with the second clip, wherein the audio ducking comprises adjusting a level of a signal of the second clip based at least in part on the level change parameters, wherein adjusting the level of the signal of the second clip in the audio ducking is determined based at least in part on the average level of the first clip to minimize modulation while the first clip is used with the second clip.

19. The computer system of claim 18, wherein the operations further comprise:
 displaying a plurality of tracks in a user interface, each track of said plurality of tracks including at least one audio clip, wherein the plurality of tracks comprise the first clip and the second clip; and
 linking the first clip to the second clip, wherein said linking further comprises linking at least one other clip of a same track as said first clip to said second clip of said plurality of tracks.

20. The computer system of claim 18, wherein the operations further comprise:
 displaying a plurality of tracks in a user interface, each track of said plurality of tracks including at least one audio clip, wherein the plurality of tracks comprise the first clip and the second clip; and
 linking the first clip to the second clip, wherein said linking a first clip further comprises linking said first clip to at least one other clip of a same track as said second clip.

21. The computer system of claim 18 wherein said level change parameters include at least one of an audio level of said second clip and a fade used for changing a level of said second clip from a first level to a second level.

* * * * *